(12) United States Patent
Karalkar et al.

(10) Patent No.: US 12,336,302 B1
(45) Date of Patent: Jun. 17, 2025

(54) VERTICAL DEVICE TRIGGERED SILICON CONTROL RECTIFIER

(71) Applicant: GlobalFoundries U.S. Inc., Malta, NY (US)

(72) Inventors: Sagar Premnath Karalkar, Chelmsford, MA (US); Alain François Loiseau, Williston, VT (US); Vibhor Jain, Clifton Park, NY (US); Wei Liang, South Burlington, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 0 days.

(21) Appl. No.: 18/654,293

(22) Filed: May 3, 2024

(51) Int. Cl.
*H10D 89/60* (2025.01)

(52) U.S. Cl.
CPC ................................ *H10D 89/713* (2025.01)

(58) Field of Classification Search
CPC .......................... H01L 27/0262; H10D 89/713
See application file for complete search history.

(56) References Cited

U.S. PATENT DOCUMENTS

| | | | |
|---|---|---|---|
| 5,825,600 A | 10/1998 | Watt | |
| 6,605,493 B1 | 8/2003 | Yu | |
| 6,770,918 B2 * | 8/2004 | Russ | ................... H01L 29/7436 257/361 |
| 7,514,751 B2 | 4/2009 | Vashchenko et al. | |
| 8,120,887 B2 * | 2/2012 | Mallikararjunaswamy | ................... H10D 89/713 361/111 |
| 8,455,949 B2 | 6/2013 | Gossner et al. | |
| 9,324,849 B2 | 4/2016 | Chung | |
| 9,882,003 B1 | 1/2018 | Aharoni | |
| 10,727,327 B2 | 7/2020 | Mishra et al. | |
| 2007/0262386 A1 | 11/2007 | Gossner et al. | |
| 2007/0279824 A1 * | 12/2007 | Mallikararjunaswamy | ................. H10D 89/713 257/E29.225 |
| 2008/0218922 A1 | 9/2008 | Mallikararjunaswamy et al. | |
| 2010/0001783 A1 * | 1/2010 | Ronsisvalle | ......... H10D 84/138 257/140 |
| 2011/0163384 A1 * | 7/2011 | Takasu | ................. H10D 62/116 257/E23.002 |
| 2013/0240992 A1 | 9/2013 | Gossner et al. | |

(Continued)

FOREIGN PATENT DOCUMENTS

| | | |
|---|---|---|
| CN | 112838123 A | 5/2021 |
| DE | 102006022105 | 11/2007 |

OTHER PUBLICATIONS

Specification and Drawings filed Jan. 3, 2024 in related U.S. Appl. No. 18/403,235, 29 pages.

(Continued)

*Primary Examiner* — Khaja Ahmad
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to a device triggered silicon control rectifier (SCR) and methods of manufacture. the structure includes: a vertical silicon controlled rectifier having a diffusion region in a well of a semiconductor substrate; a vertical triggering device sharing the diffusion region with the vertical silicon controlled rectifier; and a body contact adjacent to the vertical triggering device and electrically connecting to the well.

18 Claims, 8 Drawing Sheets

(56) References Cited

U.S. PATENT DOCUMENTS

| | | | |
|---|---|---|---|
| 2014/0339603 A1* | 11/2014 | Kuo | H01L 27/0262 257/173 |
| 2016/0285262 A1 | 9/2016 | Chao | |
| 2017/0062406 A1* | 3/2017 | Ko | H01L 29/0649 |
| 2018/0012961 A1* | 1/2018 | Aharoni | H01L 27/0266 |
| 2019/0051646 A1* | 2/2019 | Salcedo | H01L 27/0262 |
| 2021/0280699 A1* | 9/2021 | Nath | H01L 29/04 |
| 2023/0163123 A1 | 5/2023 | Vendt et al. | |

OTHER PUBLICATIONS

Specification and Drawings filed Jan. 3, 2024 in related U.S. Appl. No. 18/403,206, 23 pages.

Specification and Drawings filed Dec. 4, 2023 in related U.S. Appl. No. 18/528,223, 26 pages.

Specification and Drawings filed Nov. 9, 2023 in related U.S. Appl. No. 18/388,441, 25 pages.

Liao Changjun et al., "A low-voltage triggering SCR for ESD protection in a 0.35um SiGe BiCMOS process" 2016 IEEE International Nanoelectronics Conference (INEC), Chengdu, China, 2016, pp. 1-2, doi: 10.1109/INEC.2016.7589450, 2 pages.

Markus P.J. Mergens et al., "Diode-Triggered SCR (DTSCR) for RF-ESD Protection of BiCMOS SiGe HBTs and CMOS Ultra-Thin Gate Oxides" IEEE International Electron Devices Meeting 2003, Washington, DC, USA, 2003, 4 pages.

Jing Liu et al., "A Novel High Holding Voltage ESD device based on SCR and SiGe", Journal of Physics: Conference Series, vol. 2370, 2022 International Symposium on Semiconductor and Electronic Technology (ISSET 2022) Aug. 12, 2022-Aug. 14, 2022 Fuzhou, China, 7 pages.

Srivatsan Parthasarathy et al., "Design of SCR devices for SiGe BiCMOS applications," 2011 IEEE Bipolar/BiCMOS Circuits and Technology Meeting, Atlanta, GA, USA, 2011, pp. 235-238, doi: 10.1109/BCTM.2011.6082789, Abstract, 2 pages.

Feibo Du et al., "Vertical bipolar junction transistor triggered silicon-controlled rectifier for nanoscale ESD engineering", Electronics Letters, Mar. 30, 2020, vol. 56, No. 7 pp. 350-351, https://doi.org/10.1049/el.2019.3864, 3 pages.

H. Xie et al., "A New Low-Parasitic Polysilicon SCR ESD Protection Structure for RF ICs" in IEEE Electron Device Letters, vol. 26, No. 2, Feb. 2005, pp. 121-123, 3 pages; DOI: 101109/LED.2004.841860.

Hailian Liang, et.al "Design of a Gate Diode Triggered SCR for Dual-Direction High-Voltage ESD Protection", in IEEE Electron Device Letters, vol. 40, No. 2, pp. 163-166, Feb. 2019, doi: 10.1109/LED.2018.2890105, Abstract, 4 pages.

Ming-Dou Ker, et al. "Native-NMOS-Triggered SCR With Faster Turn-On Speed for Effective ESD Protection in a 0.13-μm CMOS Process", in IEEE Transactions On Device and Materials Reliability, vol. 5, No. 3, Sep. 2005, 12 pages.

Christian C. Russ et.al., "GGSCRs: GGNMOS Triggered Silicon Controlled Rectifiers for ESD Protection in Deep Sub-Micron CMOS Processes", 2001 Electrical Overstress/Electrostatic Discharge Symposium, Portland, OR, USA, 2001, pp. 22-31, Abstract, 4 pages.

Fei Ma et al., "Comparison of different MOS-triggered SCR structures for on-chip ESD protection", ICCRD2011—2011 3rd International Conference on Computer Research and Development. 3. 10.1109/ICCRD.2011.5764207, Abstract, 3 pages.

S. Voldman et al. "Electrostatic discharge and high current pulse characterization of epitaxial-base silicon-germanium heterojunction bipolar transistors," 2000 IEEE International Reliability Physics Symposium Proceedings. 38th Annual (Cat. No.00CH37059), San Jose, CA, USA, 2000, pp. 310-316, doi: 10.1109/RELPHY.2000.843932, Abstract, 4 pages.

Extended European Search Report and Opinion dated Feb. 28, 2025 for European Application No. EP 24207961.4-1211, 11 pages.

Extended European Search Report and Opinion dated Feb. 28, 2025 for European Application No. EP 24181555.4-1211, 11 pages.

Parthasarathy et al., "Design of SCR Devices for Si Ge BiCMOS Applications." Bipolar/Bicmos Circuits and Technology Meeting (BCTM), 2011 IEEE, IEEE, Oct. 9, 2011 (Oct. 9, 2011), pp. 235-238, XP032011158, DOI: 10.1109/BCTM.2011.6082789 ISBN: 978-1-61284-165-6, 4 Pages.

Du et al., "Vertical bipolar 1-9, 15 junction transistor triggered silicon-controlled rectifier for nanoscale ESD engineering", Electronics Letters, the Institution of Engineering and Technology, GB, vol. 56, No. 7, Mar. 30, 2020 (Mar. 30, 2020), pp. 350-351, XP006089832, ISSN: 0013-5194, DOI: 10.1049/ EL.2019.3864, 2 Pages.

Song et al., "Compact MOS-triggered SCR with faster turn-on speed for ESD protection." https://ieeexplore.ieee.org/document/5764207, 2011 3rd International Conference on Computer Research and Development, Mar. 11-13, 2011, 5 Pages.

* cited by examiner

VERTICAL DEVICE TRIGGERED SILICON CONTROL RECTIFIER

BACKGROUND

The present disclosure relates to semiconductor structures and, more particularly, to a device triggered silicon control rectifier (SCR) and methods of manufacture.

SCRs are used for electrostatic discharge (ESD) protection of integrated circuits (ICs) from the sudden flow of electricity caused by, for example, contact, electrical shorts, or dielectric breakdown. Because of high current handling ability per unit area of an SCR, ESD devices utilizing SCR can protect ICs from failure. These devices are most often used in high performance analog and radiofrequency (RF) designs for chips that have large signal swings, low leakage, and low capacitance. Due to the capacitance loading and poor harmonics of SCRs, RF performance may be impacted.

SUMMARY

In an aspect of the disclosure, a structure comprises: a vertical silicon controlled rectifier comprising a diffusion region in a well of a semiconductor substrate; a vertical triggering device sharing the diffusion region with the vertical silicon controlled rectifier; and a body contact adjacent to the vertical triggering device and electrically connecting to the well.

In an aspect of the disclosure, a structure comprises: a vertical silicon controlled rectifier comprising a base region comprising a first conductivity type, an emitter region comprising a second conductivity type, and a diffusion region comprising the first conductivity type in a well of the second conductivity type; and a vertical triggering device configured to trigger the vertical silicon controlled rectifier, the vertical triggering device comprising a base region comprising the second conductivity type, an emitter region comprising the first conductivity type, and the diffusion region shared with the vertical controlled rectifier; and a body contact to the well, the body contact comparing the second conductivity type.

In an aspect of the disclosure, a method comprises: forming a vertical silicon controlled rectifier comprising a diffusion region in a well of a semiconductor substrate; forming a vertical triggering device sharing the diffusion region with the vertical silicon controlled rectifier; and forming a body contact adjacent to the vertical triggering device and electrically connecting to the well.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a device triggered silicon control rectifier (SCR) and methods of manufacture. In embodiments, the device may be an SCR with a vertical bipolar transistor and a vertical triggering device. The vertical triggering device may be an NPN or PNP and the SCR may be a PNPN or NPNP. Advantageously, the structures described herein exhibit lowered trigger voltage, an additional current path with a higher beta and faster switching times. Moreover, the structures described herein offer different trigger voltages compared to conventional electrostatic discharge (ESD) devices.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
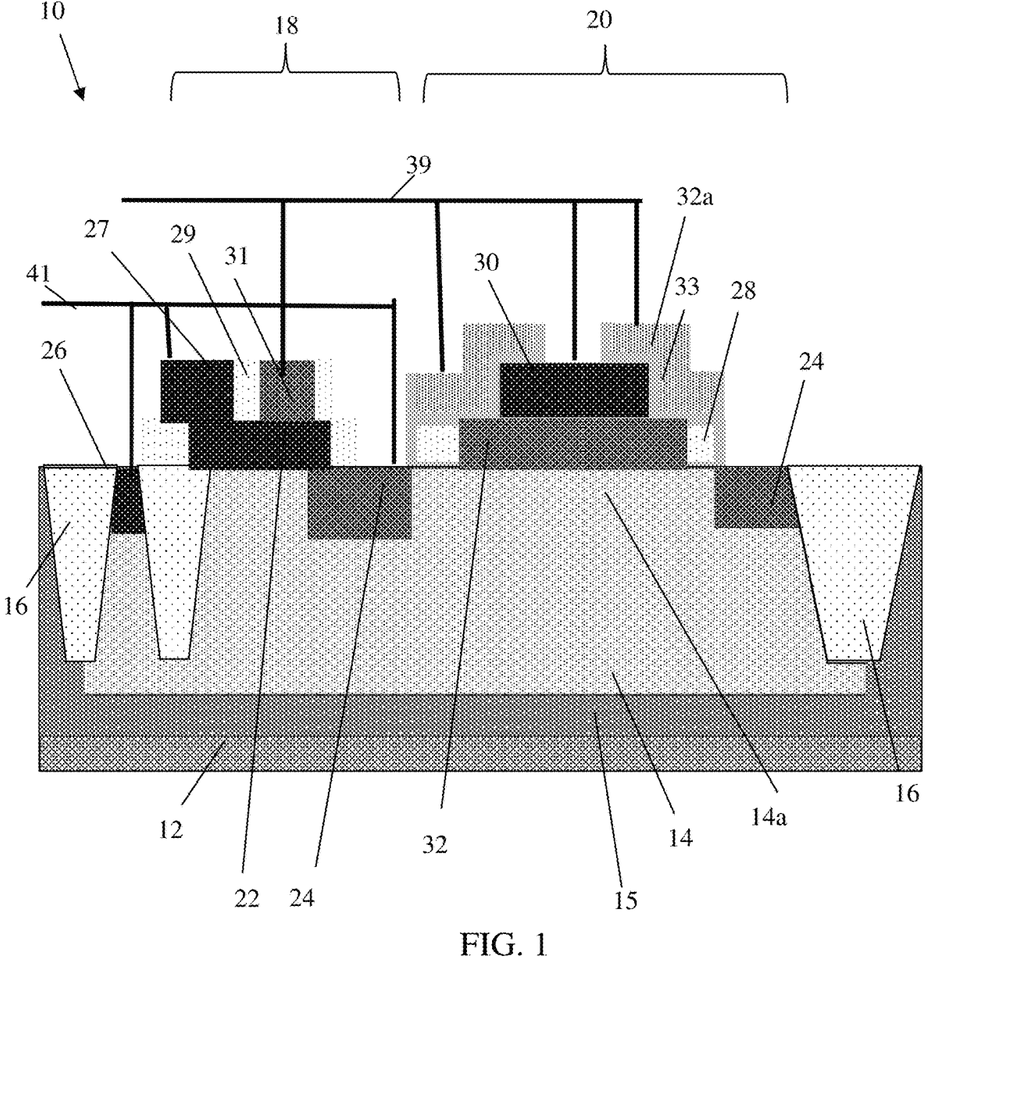
FIG. 1 shows a device triggered silicon control rectifier (SCR) and respective fabrication processes in accordance with aspects of the present disclosure.

FIG. 1 shows a device triggered silicon control rectifier (SCR) and respective fabrication processes in accordance with aspects of the present disclosure. The structure 10 of FIG. 1 includes a vertical triggering device 18 and SCR 20 over p-well 14 in a well 15 in a semiconductor substrate 12. In embodiments, the well 15 may be a deep n-well. The p-well 14 may be formed by a conventional ion implantation process with p-type dopants, e.g., Boron (B), as is known in the art such that no further explanation is required for a complete understanding of the present disclosure. Similarly, the n-well 15 may be formed by a conventional ion implantation process with n-type dopants, e.g., Arsenic (A), Antimony (SB), phosphorus (P), etc., as is known in the art such that no further explanation is required for a complete understanding of the present disclosure.

The semiconductor substrate 12 may be composed of any suitable semiconductor material including, but not limited to, Si, SiGe, SiGeC, SiC, GaAs, InAs, InP, and other III/V or II/VI compound semiconductors. The semiconductor substrate 12 may also comprise any suitable single crystallographic orientation (e.g., a (100), (110), (111), or (001) crystallographic orientation). In further embodiments, the semiconductor substrate 12 may be a bulk substrate comprising the semiconductor materials described herein or, alternatively, may comprise semiconductor on insulator technology as is known in the art. In the semiconductor on insulator technology, the semiconductor substrate 12 would be a top semiconductor layer over an insulator material and a handle substrate as is known in the art.

In FIG. 1, the vertical triggering device 18 may be a vertical NPN device (transistor); whereas the SCR 20 may be a vertical PNPN SCR. In embodiments, the vertical triggering device 18 may be a triggering device for the SCR 20.

The vertical triggering device 18 includes a P+ region 22 (e.g., base region) extending to an overlapping an N+ diffusion region 24 within the p-well 14, e.g., tied directly to the p-well 14. The P+ region 22 may be, for example, epitaxially grown P—SiGe. In embodiments, the P—SiGe may be epitaxially grown over the p-well 14 with an in-situ doping process using p-type dopants, e.g., Boron.

A collector region 31 may be formed on the P+ region 22. In embodiments, the collector region 31 may be N+ semiconductor material, e.g., N+ polysilicon material. An extrinsic base 27 may be formed on the P+ region 22 and adjacent to the collector 31. In embodiments, the extrinsic base 27 may be any appropriate P+ semiconductor material, e.g., SiGe. In this way, the vertical triggering device 18 is an NPN device, e.g., e.g., N+ collector 31, P+ region 22 and N+ diffusion region 24.

Insulator material 29 may be used to isolate the collector region 31 from the extrinsic base 27. The insulator material 29 may be sidewall spacers formed from oxide material, nitride material or combinations thereof. The insulator material 29 may be deposited by a conventional deposition method, e.g., chemical vapor deposition (CVD), followed by an anisotropic etching process.

A P+ body contact 26 may be provided in the p-well 14, adjacent to the vertical triggering device 18. In embodiments, the P+ body contact 26 may be electrically connected to the well 14 and, more specifically, the collector 14a. The P+ body contact 26 may also be isolated from the vertical triggering device 18 and SCR 20 by deep trench isolation structures 16. The P+ body contact 26, extrinsic base 27 and collector region 31 may be fully or partially silicide region on a top surface.

Still referring to FIG. 1, the vertical SCR 20 includes a P+ emitter 30, N+ base region 32 and the N+ diffusion region 24. As noted herein, the N+ diffusion region 24 is shared with the vertical triggering device 18 and the SCR 20. In addition, the SCR 20 includes a p+ collector region 14a in the p-well 14, between the base region 32 and the N+ diffusion region 24. In this way, the SCR 20 is a PNPN device.

The base region 32 may be laterally separated from the N+ diffusion region 24 by sidewall spacers 28. In embodiments, the sidewall spacers 28 may be an oxide material, nitride material or combinations thereof. The base region 32 may include an extrinsic base region 32a (e.g., N+ tap region) in direct contact with the base region 32. The extrinsic base region 32a may be isolated from the P+ emitter 30 by insulator material 33. Also, the extrinsic base region 32a and P+ emitter 30 may include a fully or partially silicide region on a top surface.

The P+ emitter 30 may comprise polysilicon material and the base region 32 may comprise, e.g., n-doped SiGe. The n-doped SiGe may be epitaxially grown on the semiconductor substrate 12, with an in-situ doping. In embodiments, the in-situ doping may be n-type dopants, e.g., Arsenic (As), Phosphorus (P) and Antimony (Sb), among other suitable examples. As noted herein, the dopant for the base region 32 is an opposite conductivity type compared to the dopant for the base region 22. The extrinsic base region 32a may also be N—SiGe.

The extrinsic base region 32a, P+ emitter 30 and N+ collector region 31 are connected to wiring structures 39. In embodiments, the extrinsic base region 32a, P+ emitter 30 and N+ collector region 31 may be connected to an anode. Moreover, the N+ diffusion region 24, the extrinsic base 27 and the P+ body contact 26 are connected to wiring structures 41. In embodiments, the N+ diffusion region 24, the extrinsic base 27 and the P+ body contact 26 may be connected to a cathode.

In embodiments, the structure shown in FIG. 1 may be an asymmetrical device or a symmetrical device. In the symmetrical device, for example, the NPN can be provided above the N+ diffusion region 24, on both sides of the device, e.g., on both sides of the SCR 20 is a PNPN device. It should be recognized that each of the different embodiments may similarly be an asymmetrical device or a symmetrical device in a similar manner.

Figure 2:
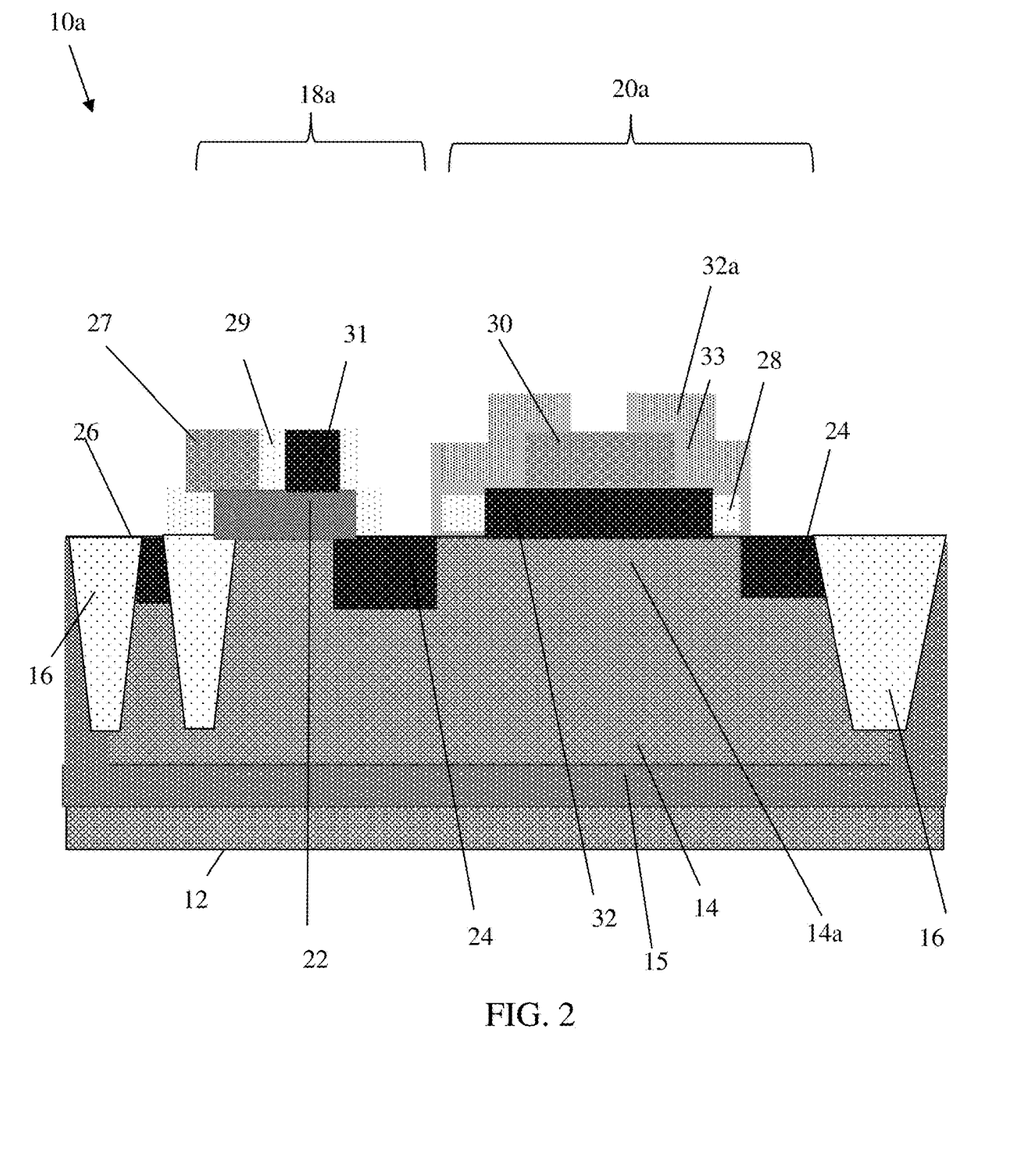
FIGS. 2-6 show device triggered SCRs and respective fabrication processes in accordance with additional aspects of the present disclosure.

FIG. 2 shows a device triggered SCR in accordance with additional aspects of the present disclosure. The structure 10a of FIG. 2 includes a vertical PNP triggering device 18a and a vertical NPNP SCR 20a. The vertical PNP device 18a may be a triggering device for the SCR 20a.

In embodiments, the structure 10a includes an n-well 14 and a deep p-well 15 in the semiconductor substrate 12. The n-well 14 may be formed by a conventional ion implantation process with n-type dopants, e.g., Arsenic (As), Phosphorus (P) and Antimony (Sb), among other suitable examples as is known in the art. The p-well 15 may be formed by a conventional ion implantation process with p-type dopants, e.g., Boron (B), as is known in the art. The semiconductor substrate 12 may be composed of any suitable semiconductor material with any suitable single crystallographic orientation as already disclosed herein. In further embodiments, the semiconductor substrate 12 may be a bulk substrate or, alternatively, may comprise semiconductor on insulator technology as is known in the art.

Still referring to FIG. 2, the vertical triggering device 18a includes an N+ region 22 (e.g., base region) extending to an overlapping a P+ diffusion region 24 within the n-well 14, e.g., tied directly to the n-well 14. The N+ region 22 may be, for example, N—SiGe, epitaxially grown over the n-well 14 with an in-situ doping process using n-type dopants, e.g., Arsenic (As), Phosphorus (P) and Antimony (Sb), amongst other examples. A collector region 31 may be formed on the N+ region 22. In embodiments, the collector region 31 may be P+ semiconductor material, e.g., P+ polysilicon material. An extrinsic base 27 may be formed on the N+ region 22 and adjacent to the collector 31. In embodiments, the extrinsic base 27 may be any appropriate N+ semiconductor material, e.g., SiGe. In this way, the vertical triggering device 18a is a PNP device, e.g., e.g., N+ collector 31, N+ region 22 and P+ diffusion region 24.

Insulator material 29 may be used to isolate the collector region 31 from the extrinsic base 27. The insulator material 29 may be sidewall spacers formed from oxide material, nitride material or combinations thereof. The insulator material may be deposited by a conventional deposition method, e.g., chemical vapor deposition (CVD), followed by an anisotropic etching process.

A N+ body contact 26 is provided in the n-well 14, adjacent to the vertical triggering device 18a. In embodiments, the N+ body contact 26 may be electrically connected to the well 14 and, more specifically, the collector 14a. Also, the N+ body contact 26 may be isolated from the vertical triggering device 18a and SCR 20a by the deep trench isolation structures 16. The deep trench isolation structures 16 may also be used to isolate the triggering device 18a and the SCR 20a. The N+ body contact 26, extrinsic base 27 and emitter 30 may be fully or partially silicide region on a top surface.

Still referring to FIG. 2, the vertical SCR 20a includes an N+ emitter 30, P+ base region 32 and the P+ diffusion region 24. The base region 32 may include an extrinsic base region 32a (e.g., P+ tap region) in direct contact with the base region 32. As noted herein, the P+ diffusion region 24 is shared with the vertical triggering device 18a and the SCR 20a. In addition, the SCR 20a includes an N+ collector region 14a in the n-well 14, between the base region 32 and the P+ diffusion region 24. In this way, the SCR 20 is a NPNP device.

The P+ base region 32 may be laterally separated from the P+ diffusion region 24 by sidewall spacers 28. In embodiments, the sidewall spacers 28 may be an oxide material, nitride material or combinations thereof. The extrinsic base region 32a may be isolated from the N+ emitter 30 by insulator material 33. Also, the extrinsic base region 32a and the N+ body contact 26 may include a fully or partially silicide region on a top surface.

The N+ emitter 30 may comprise polysilicon material and the base region 32 may comprise, e.g., n-doped SiGe. The n-doped SiGe may be epitaxially grown on the semiconductor substrate 12, with an in-situ doping of n-type dopants. In embodiments, the in-situ doping may be n-type dopants, e.g., Arsenic (As), Phosphorus (P) and Antimony (Sb), among other suitable examples. As noted herein, the dopant for the base region 32 is an opposite conductivity type compared to the dopant for the base region 22.

In embodiments, the extrinsic base region 32a, N+ emitter 30 and P+ collector region 31 and extrinsic base 27 may be connected to a cathode. Moreover, the P+ diffusion region 24 and the N+ body contact 26 may be connected to an anode.

Figure 3:
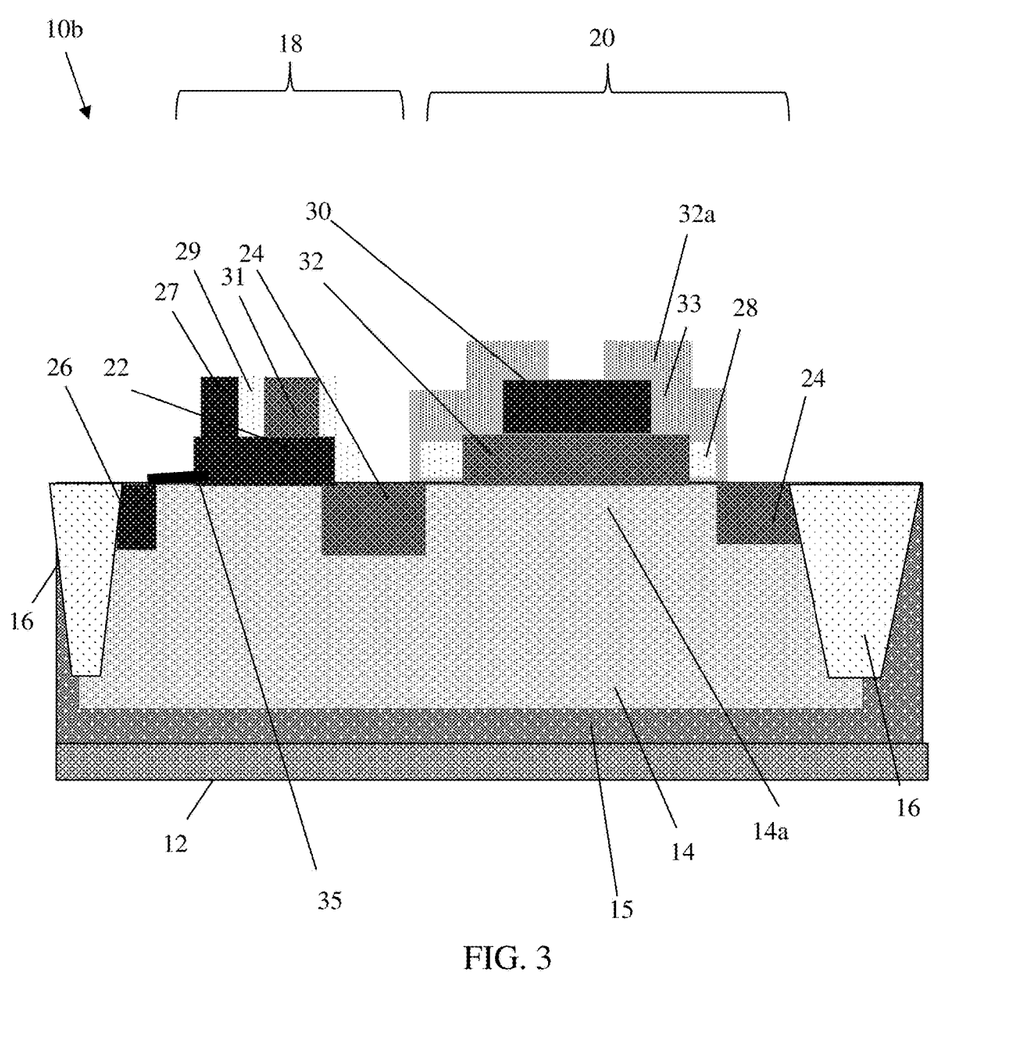

FIG. 3 shows a structure 10b similar to the structure 10 of FIG. 1. In FIG. 3, the structure 10b includes a silicide block 35 bridging between the P+ region 22 (e.g., P—SiGe) and the P+ body contact 26. In embodiments, the silicide block 35 may be nitride, for example, formed on a surface of the well 14 between the P+ region 22 and the P+ body contact 26. The deep trench isolation structure between the P+ region 22 and the P+ body contact 26 may also be removed. As should be understood by those of skill in the art, the silicide block 35 will lower a current needed to trigger the SCR 20 and, hence, improve Ron resistance. The remaining features of the structure 10b are similar to the structure 10 of FIG. 1.

Figure 4:
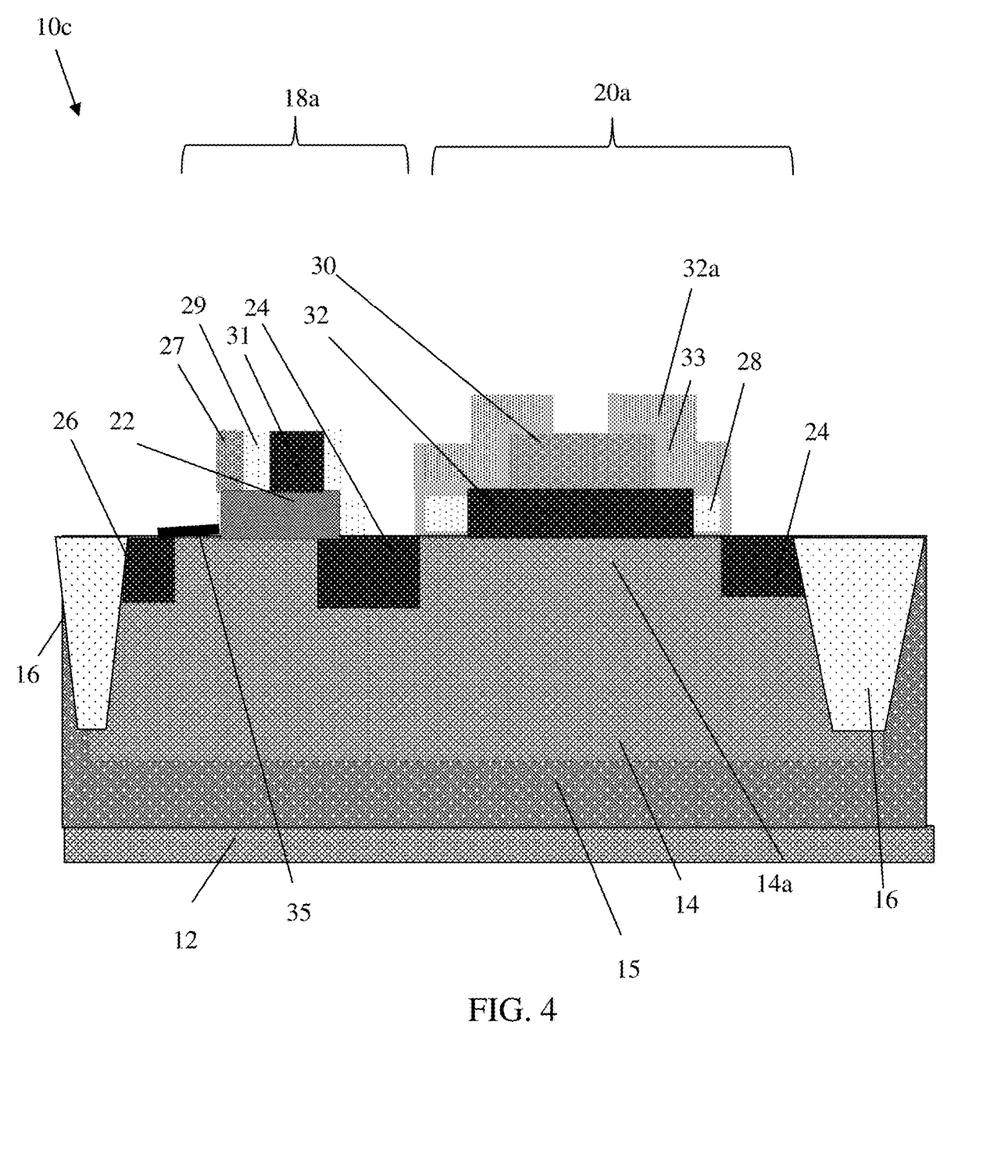

FIG. 4 shows a structure 10c similar to the structure 10a of FIG. 2. The structure 10c includes the silicide block 35 bridging between the N+ region 22 (N—SiGe) and the N+ body contact 26. In embodiments, the silicide block 35 may be nitride, for example, formed on a surface of the well 14 between the N+ region 22 and the N+ body contact 26. The deep trench isolation structure between the N+ region 22 and the N+ body contact 26 may also be removed. As noted above, the silicide block 35 will lower a current needed to trigger the SCR 20 and, hence, improve Ron resistance. The remaining features of the structure 10d are similar to the structure 10a of FIG. 2.

Figure 5:
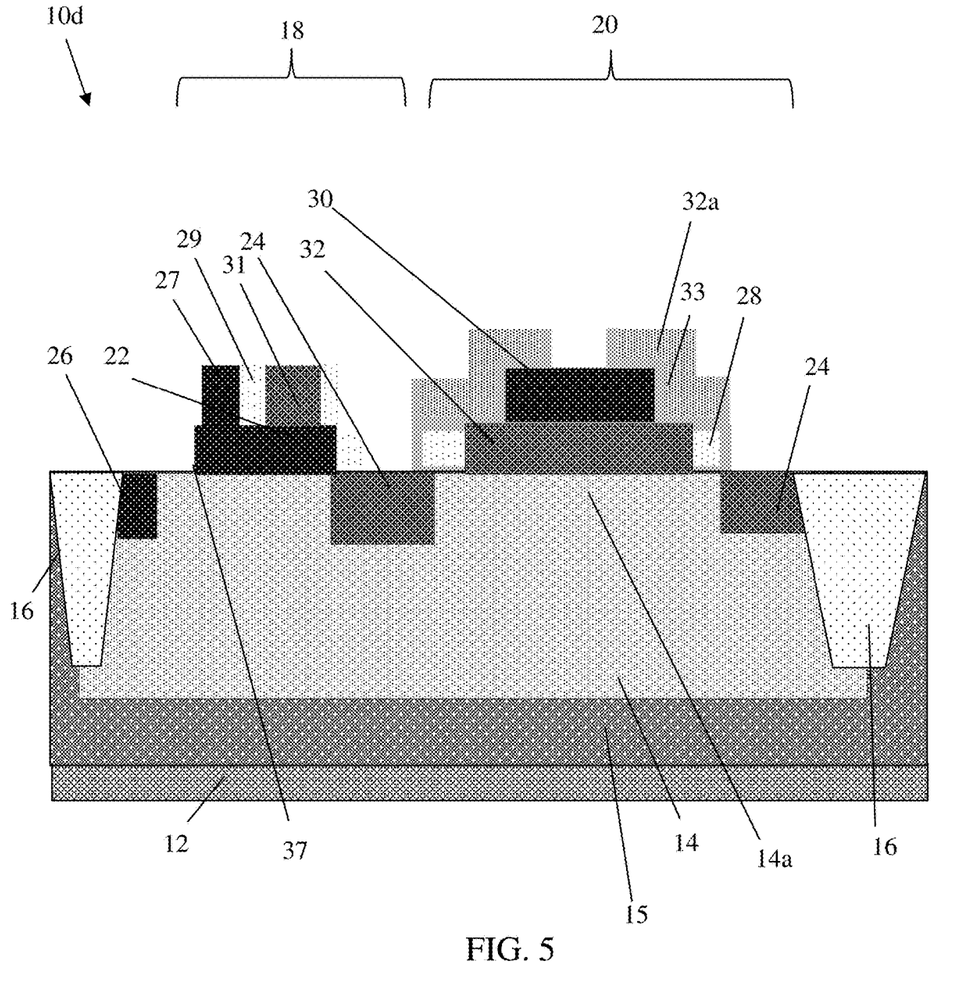

FIG. 5 shows a structure 10a similar to the structure 10 of FIGS. 1 and 10b of FIG. 3. In FIG. 5, the structure 10d includes a space 37 separating the P+ region 22 and the P+ body contact 26. The deep trench isolation structure between the P+ region 22 and the P+ body contact 26 may be removed. Also, there is no silicide block as required in FIG. 3. The remaining features of the structure 10d are similar to the structure 10 of FIG. 1 and structure 10b of FIG. 3.

Figure 6:
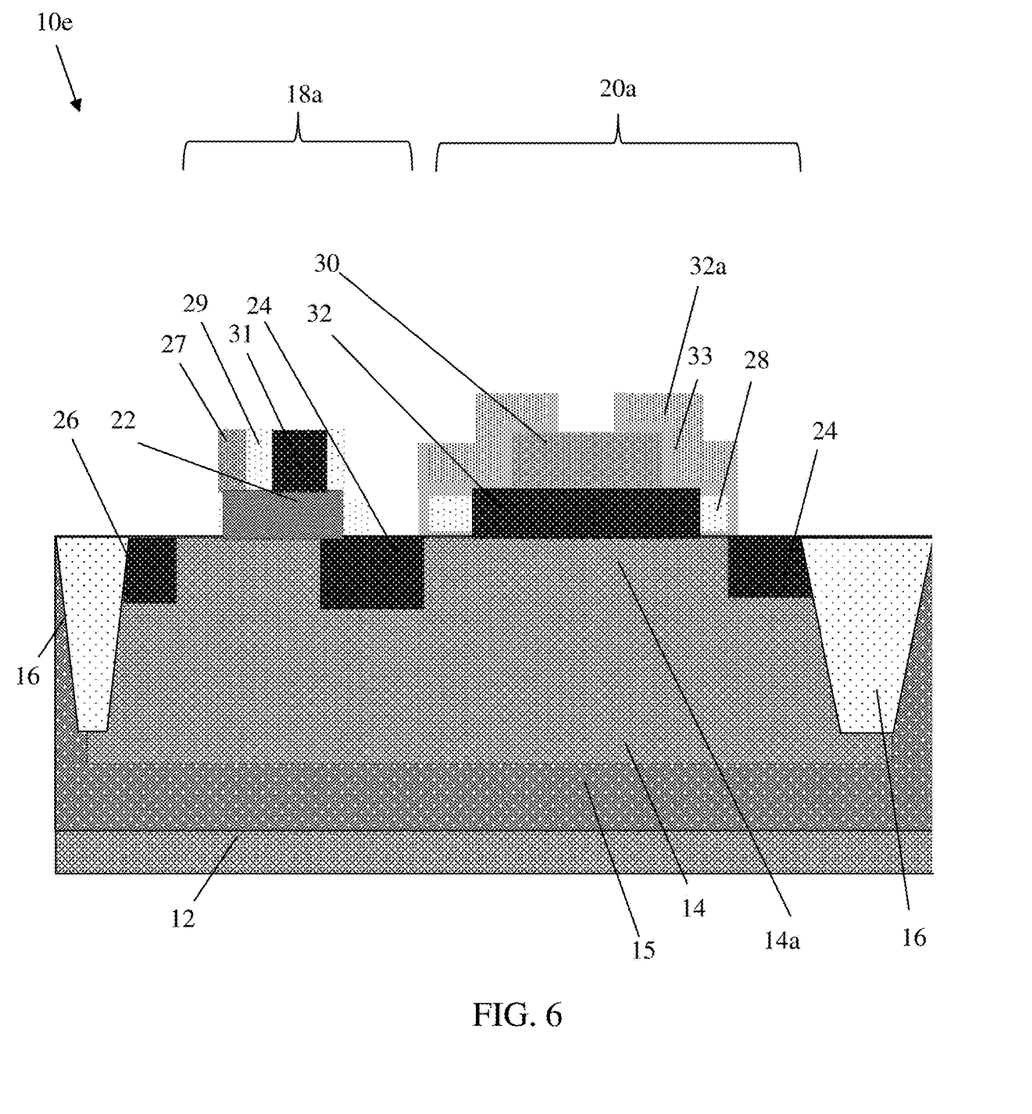

FIG. 6 shows a structure 10c similar to the structure 10a of FIG. 2 and the structure 10c of FIG. 4. In FIG. 6, the structure 10e includes a space 37 separating N+ region 22 and the N+ body contact 26. The deep trench isolation structure between the N+ region 22 and the N+ body contact 26 may be removed. Also, there is no silicide block as required in FIG. 4. The remaining features of the structure 10d are similar to the structure 10a of FIG. 2 and the structure 10c of FIG. 4.

FIGS. 7A-7D show cross-sectional views of steps in the fabrication processes of the device triggered SCR of FIG. 1. It should be recognized by those of skill in the art that the fabrication processes shown in FIGS. 7A-7D may equally represent fabrication processes of the device triggered SCR of FIGS. 2-6. For example, it should be understood by those of ordinary skill in the art that the diffusion regions, body contacts and other dopant types of FIGS. 1, 3 and 5 may be formed by conventional ion implantation processes and in-situ dopant processes with different dopant types compared FIGS. 2, 4 and 6. For example, FIGS. 1, 3 and 5 show an p-type well in the semiconductor substrate with a P+ body contact, whereas FIGS. 2, 4 and 6 show an n-type well in the semiconductor substrate with a N+ body contact. Similarly, FIGS. 1, 3 and 5 show a P—SiGe for the vertical triggering device 18 and an N—SiGe for the SCR 20, whereas FIGS. 2, 4 and 6 show an N—SiGe for the vertical triggering device 18a and a P—SiGe for the SCR 20a.

Figure 7A:
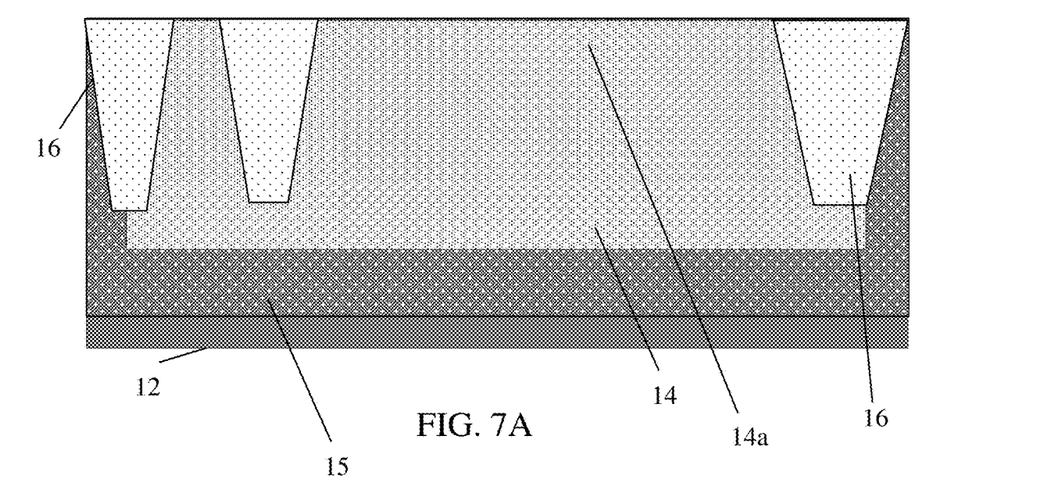
FIGS. 7A-7D show cross-sectional views of steps in the fabrication processes of the device triggered SCR of FIG. 1 in accordance with further aspects of the present disclosure.

As shown in FIG. 7A, for example, deep trench isolation structures 16 are formed in the semiconductor substrate 12 by conventional lithography, etching and deposition processes. For example, a resist formed over the semiconductor substrate 12 is exposed to energy (light) and developed utilizing a conventional resist developer to form a pattern (opening). An etching process with a selective chemistry, e.g., reactive ion etching (RIE), will be used to transfer the pattern from the photoresist layer to the semiconductor substrate 12 to form one or more trenches in the semiconductor substrate 12 through the openings of the resist. Following the resist removal by a conventional oxygen ashing process or other known stripants, insulator material (e.g., $SiO_2$) can be deposited by any conventional deposition processes, e.g., CVD processes. Any residual material on the surface of the semiconductor substrate 12 can be removed by conventional chemical mechanical polishing (CMP) processes.

The wells 14, 15 can be formed by conventional ion implantation processes prior to or after the formation of the deep trench isolation structures 16. The formation of the wells is described with respect to FIG. 7B for simplicity.

Figure 7B:
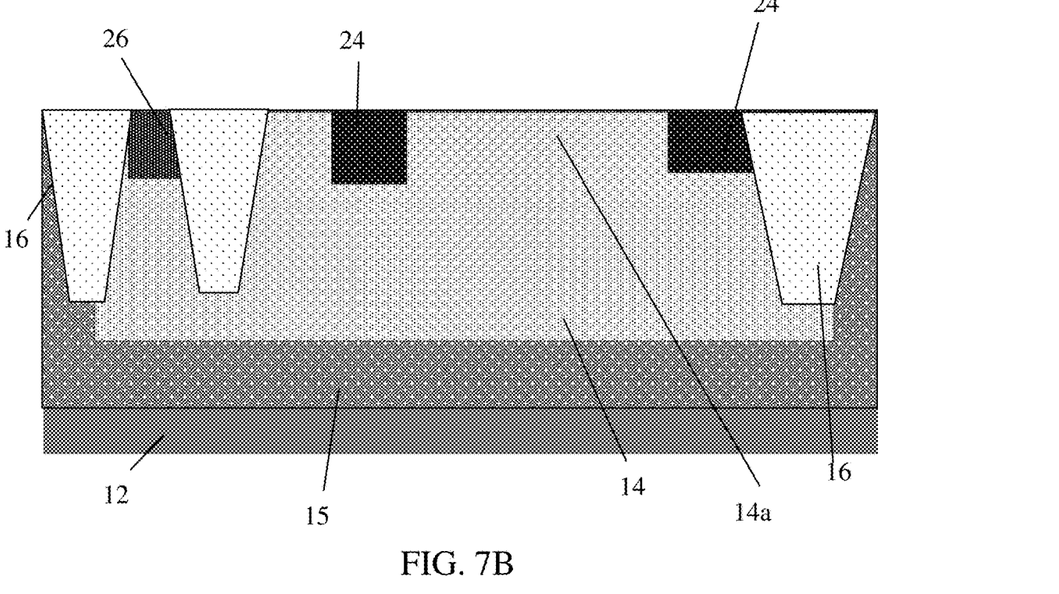

In FIG. 7B, for example, respective patterned implantation masks may be used to define selected areas exposed for the implantations within the semiconductor substrate 12. The implantation mask used to select the exposed area for forming diffusion regions 24 may be stripped after implantation, and before the implantation mask used to form the body contacts 26 of different dopant type (or vice versa). In addition, different implantation mask may be used to form the wells 14, 15, e.g., p-well or n-well, in the different structures.

The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. The p-type dopants may be, e.g., Boron (B), and the n-type dopants may be, e.g., Arsenic (As), Phosphorus (P) and Sb, among other suitable examples.

Figure 7C:
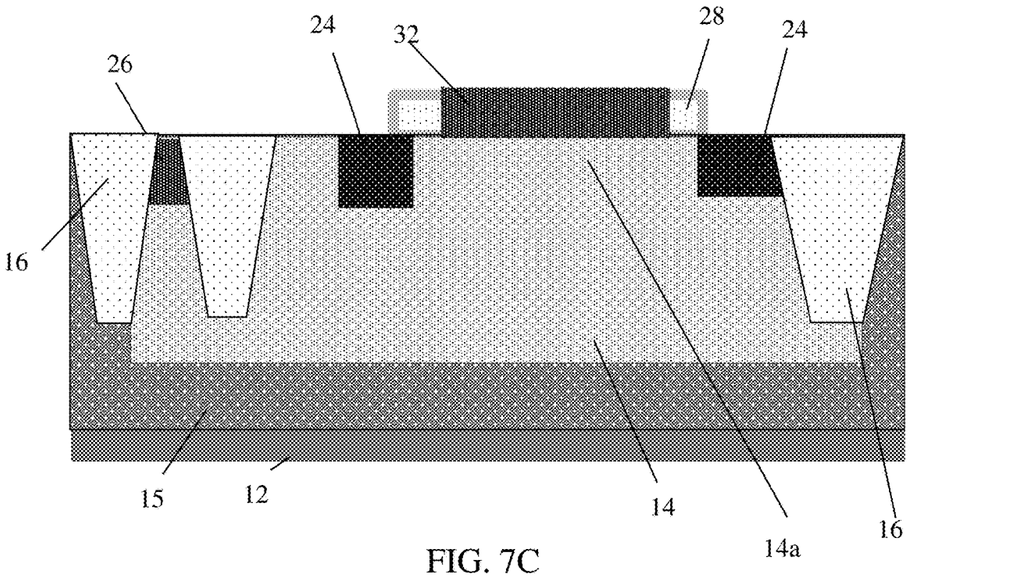

In FIG. 7C, the base region 32 for the SCRs 20a may be formed by an epitaxial growth process with an in-situ doping process as is known in the art. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The epitaxial growth may be performed at a temperature of from 300° C. to 800° C. The epitaxial growth can be performed utilizing any well-known precursor gas or gas mixture. Carrier gases like hydrogen, nitrogen, helium and argon can be used. A dopant (n-type or p-type, as defined below) is typically added to the precursor gas or gas mixture.

The sidewall spacers (insulator material) 28 may also be formed by conventional deposition processes, followed by an anisotropic etching process as is known in the art. In embodiments, the sidewall spacers 28 are aligned with the diffusion regions 24. The sidewall spacers 28 may be used to isolate the SCR from the diffusion regions 24.

Figure 7D:
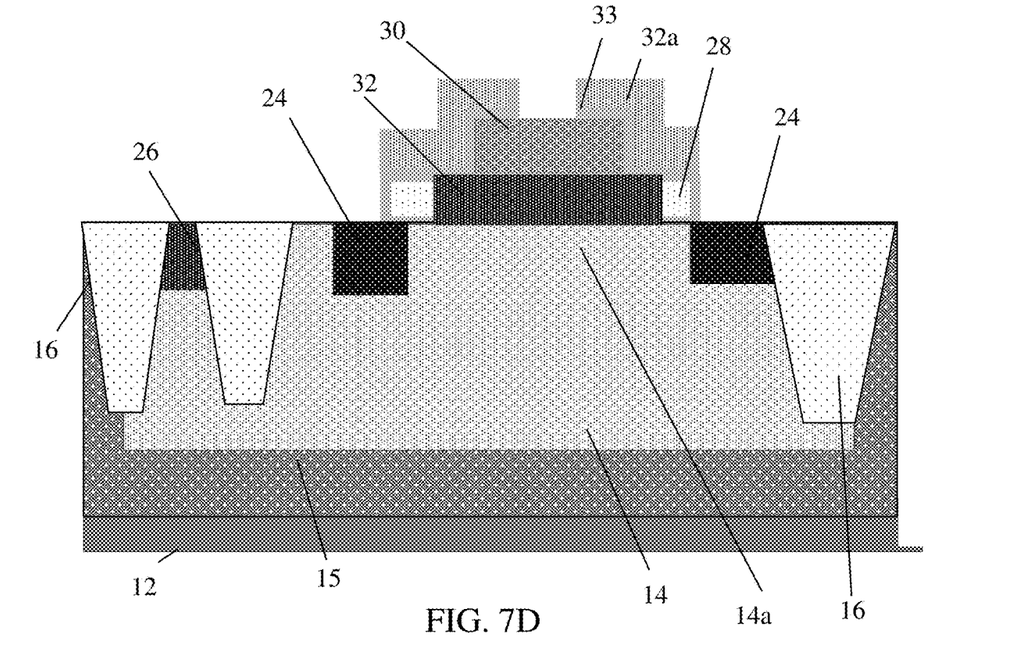

FIG. 7D shows the fabrication of the emitter region 30, the extrinsic base region 32a (e.g., extrinsic base) and deep well 15. The emitter region 30 may be fabricated by a conventional epitaxial growth process with an in-situ doping. In the structure of FIG. 1, the doping would be a p-type dopant; whereas in the structure of FIG. 2, the doping would be an n-type dopant. Following a conventional deposition process for forming sidewall spacers (insulator material) 33 and a patterning process to expose portions of the base region 32, the base region 32a may be deposited and in contact with the base region 32.

Referring back to FIG. 1, the features of the vertical triggering devices 18 may be formed similarly to that of the SCR 20 described above such that no further explanation is required for a complete understanding of the invention. For example, the P+ region 22 (P—SiGe) may be epitaxially grown on the substrate; whereas the collector region 31 and the extrinsic base 27 may be epitaxially grown on the P+ region 22, followed by conventional patterning processes, e.g., lithography and etching (RIE). The sidewall spacers 29 may be formed by conventional deposition methods, e.g., CVD, followed by an anisotropic etching process, following the formation of either the collector region 31 or the extrinsic base 27 (whichever is grown first).

The wiring structures 39, 41 may be fabricated by a conventional deposition, lithography and etching processes as is known in the art such that no further explanation is required herein. For example, the deposition process may be a conventional CVD process, followed by conventional CMOS patterning processes. The wiring structures 39, 41 may be any conductive material used in semiconductor manufacturing processes for wiring structures such as aluminum, copper, tungsten or other known materials. To prevent out-diffusion, the sidewalls of trenches used for forming of the wiring structures may be lined with TaN or TiN as is known in the art.

The silicide regions may be formed by conventional silicide processes. For example, as should be understood by those of skill in the art, the silicide process begins with deposition of a thin transition metal layer, e.g., nickel, cobalt or titanium, over fully formed and patterned semiconductor material (e.g., N+ and P+ body contacts, diffusion regions, emitter, extrinsic base, etc.). After deposition of the material, the structure is heated allowing the transition metal to react with exposed silicon (or other semiconductor material as described herein) in the respective regions of the device forming a low-resistance transition metal silicide. Following the reaction, any remaining transition metal is removed by chemical etching, leaving silicide contacts in the active regions of the device.

The structures can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    a vertical silicon controlled rectifier comprising a diffusion region in a well of a semiconductor substrate;
    a vertical triggering device sharing the diffusion region with the vertical silicon controlled rectifier; and
    a body contact adjacent to the vertical triggering device and electrically connecting to the well,
    wherein the vertical silicon controlled rectifier comprises a base with a first conductivity type, the vertical triggering device comprises a base with a second conductivity type, and the diffusion region comprises the first conductivity type, and
    wherein a base of the silicon controller rectifier comprises P—SiGe, a base of the vertical triggering device comprises N—SiGe, the well comprises an n-well and the diffusion region comprises a p-type dopant.

2. The structure of claim 1, wherein the base of the silicon controller rectifier comprises N—SiGe and the base of the vertical triggering device comprises P—SiGe, the well comprises a p-well and the diffusion region comprises an n-type dopant.

3. A structure comprising:
    a vertical silicon controlled rectifier comprising a diffusion region in a well of a semiconductor substrate;
    a vertical triggering device sharing the diffusion region with the vertical silicon controlled rectifier; and
    a body contact adjacent to the vertical triggering device and electrically connecting to the well, wherein:

the vertical silicon controlled rectifier comprises a first vertical bipolar transistor with a base of a first conductivity type and an emitter of a second conductivity type; and the vertical triggering device comprises a second vertical bipolar transistor with a base of the second conductivity type overlapping the diffusion region of the first conductivity type and an emitter of the first conductivity type.

4. The structure of claim 3, wherein:

the base and the emitter of the vertical controlled rectifier and the emitter of the vertical triggering device electrically connect to an anode; and the base of the vertical triggering device, the diffusion region and the body contact to the vertical controlled rectifier electrically connect to a cathode.

5. The structure of claim 3, wherein the the base and the emitter of the vertical controlled rectifier and the base and the emitter of the vertical triggering device electrically connect to a cathode; and the diffusion region and the body contact electrically connect to an anode.

6. The structure of claim 3, wherein the vertical silicon controlled rectifier comprises a PNPN device and the triggering device comprises a vertical NPN transistor.

7. The structure of claim 3, wherein the vertical silicon controlled rectifier comprises an NPNP device and the triggering device comprises a vertical PNP transistor.

8. The structure of claim 3, further comprising a body contact region of the second conductivity type separated from the base of the second vertical bipolar transistor by a deep trench isolation structure extending into the well.

9. The structure of claim 3, further comprising a body contact region of the second conductivity type separated from the base of the second vertical bipolar transistor by a silicide block on a surface of the well between the second vertical bipolar transistor and the body contact region.

10. A structure comprising:

a vertical silicon controlled rectifier, comprising:
  a base region comprising a first conductivity type; and
  an emitter region comprising a second conductivity type;

a diffusion region comprising the first conductivity type in a well of the second conductivity type; and a vertical triggering device configured to trigger the vertical silicon controlled rectifier, the vertical triggering device comprising:
  a base region comprising the second conductivity type;
  an emitter region comprising the first conductivity type; and
  the diffusion region shared with the vertical controlled rectifier; and a body contact to the well, the body contact comparing the second conductivity type.

11. The structure of claim 10, wherein the vertical silicon controlled rectifier comprises a PNPN device, the vertical transistor comprises a vertical NPN transistor, and the PNPN device and the NPN transistor share the diffusion region of the second conductivity type.

12. The structure of claim 10, wherein the vertical silicon controlled rectifier comprises a NPNP device, the vertical transistor comprises a vertical PNP transistor, and the NPNP device and the PNN transistor share the diffusion region of the second conductivity type.

13. The structure of claim 10, further comprising a trench isolation structure isolating the body contact from the vertical triggering device.

14. The structure of claim 10, further comprising a silicide block over the well between the body contact and the vertical triggering device.

15. The structure of claim 10, wherein:

the base and the emitter of the vertical controlled rectifier and the emitter of the vertical triggering device electrically connect to an anode; and the base of the vertical triggering device, the diffusion region and the body contact to the vertical controlled rectifier electrically connect to a cathode.

16. The structure of claim 10, wherein:

the base and the emitter of the vertical controlled rectifier and the base and the emitter of the vertical triggering device electrically connect to a cathode; and the diffusion region and the body contact electrically connect to an anode.

17. The structure of claim 10, wherein the diffusion region extends underneath the base of the emitter and is separated from the base of the vertical silicon controlled rectifier by insulator material.

18. A method comprising:

forming a vertical silicon controlled rectifier over a diffusion region in a well of a semiconductor substrate;

forming a vertical triggering device sharing the diffusion region with the vertical silicon controlled rectifier; and forming a body contact adjacent to the vertical triggering device and electrically connecting to the well, wherein the vertical silicon controlled rectifier comprises a base with a first conductivity type, the vertical triggering device comprises a base with a second conductivity type, and the diffusion region comprises the first conductivity type, and wherein a base of the silicon controller rectifier comprises P—SiGe, a base of the vertical triggering device comprises N—SiGe, the well comprises an n-well and the diffusion region comprises a p-type dopant.

* * * * *